United States Patent [19]
Croft

[11] Patent Number: 5,359,211
[45] Date of Patent: Oct. 25, 1994

[54] HIGH VOLTAGE PROTECTION USING SCRS

[75] Inventor: Gregg D. Croft, Palm Bay, Fla.

[73] Assignee: Harris Corporation, Melbourne, Fla.

[21] Appl. No.: 732,475

[22] Filed: Jul. 18, 1991

[51] Int. Cl.$^5$ ............... H01L 29/74; H01L 29/06; H01L 29/78

[52] U.S. Cl. ............ 257/173; 257/362; 257/363; 361/91; 361/100; 361/101

[58] Field of Search ............ 361/100, 93, 101, 56, 361/57, 91, 111; 257/355, 356, 362, 363, 173, 174

[56] References Cited

U.S. PATENT DOCUMENTS

| | | | |
|---|---|---|---|
| 3,904,931 | 9/1975 | Leidich | 361/100 |
| 3,919,601 | 11/1975 | Suko et al. | 361/100 |
| 4,100,561 | 7/1978 | Ollendorf | 357/13 |
| 4,131,928 | 12/1978 | Davis et al. | 361/56 |
| 4,143,391 | 3/1979 | Suzuki et al. | 357/44 |
| 4,400,711 | 8/1983 | Avery | 357/43 |
| 4,460,935 | 7/1984 | Vehira | 257/355 |
| 4,484,244 | 11/1984 | Avery | 361/56 |
| 4,543,593 | 9/1985 | Fujita | 357/48 |
| 4,567,500 | 1/1986 | Avery | 357/38 |
| 4,595,941 | 6/1986 | Avery | 357/43 |
| 4,631,567 | 12/1986 | Kokado et al. | 357/38 |
| 4,633,283 | 12/1986 | Avery | 257/355 |
| 4,736,271 | 4/1988 | Mack et al. | 361/100 |
| 4,757,363 | 7/1988 | Bohm et al. | 357/23.13 |
| 4,760,433 | 7/1988 | Young et al. | 357/23.13 |
| 4,811,155 | 3/1989 | Kuriyama et al. | 361/56 |
| 4,870,530 | 9/1989 | Hurst et al. | 361/91 |
| 4,875,130 | 10/1989 | Huard | 361/56 |
| 4,891,729 | 1/1990 | Sugiyama et al. | 361/91 |
| 4,918,563 | 4/1990 | Kanai et al. | 361/91 |
| 4,939,616 | 7/1990 | Rountree | 361/56 |

OTHER PUBLICATIONS

Harris—"Wideband, High Slew Rate, High Output Current Operational Amplifier"—HA-2542—May 1990.

Harris—"Low Bias Current, Low Power JFET Input Operational Amplifier"—HA-5180—May 1990.

*Primary Examiner*—Ngan Van Ngo
*Attorney, Agent, or Firm*—Rogers & Killeen

[57] ABSTRACT

A high voltage protection circuit includes a breakdown network for providing a discharge path between a pair of terminal of a circuit to be protected. Each network conducts current between a supply terminal and another terminal at a low threshold voltage value when power is removed from the supply terminal. The network increases the threshold value when power is applied to the supply terminal to prevent conduction through the breakdown network during normal operation of the circuit to be protected. In one implementation, the protection circuit includes anti-latching circuitry connected to the breakdown network for preventing the breakdown network from latching on after or during the time power is applied to the supply terminals. To minimize the degradation of DC operating characteristics, the leakage currents, due to the protection circuit, between the first terminal and the positive supply terminal, and between the first terminal and the negative supply terminal cancel each other. The protection circuit may be incorporated on the same substrate as the circuit to be protected or it may be incorporated on a separate substrate sharing a common housing with the circuit to be protected. Alternately, the protection circuit may be in its own housing with its external leads connected to the leads of a first housing including the circuit to be protected.

22 Claims, 13 Drawing Sheets

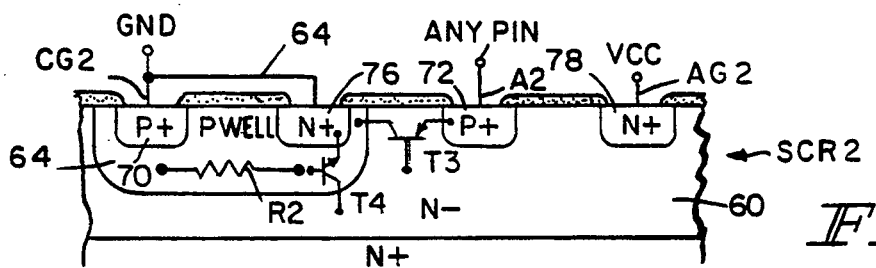
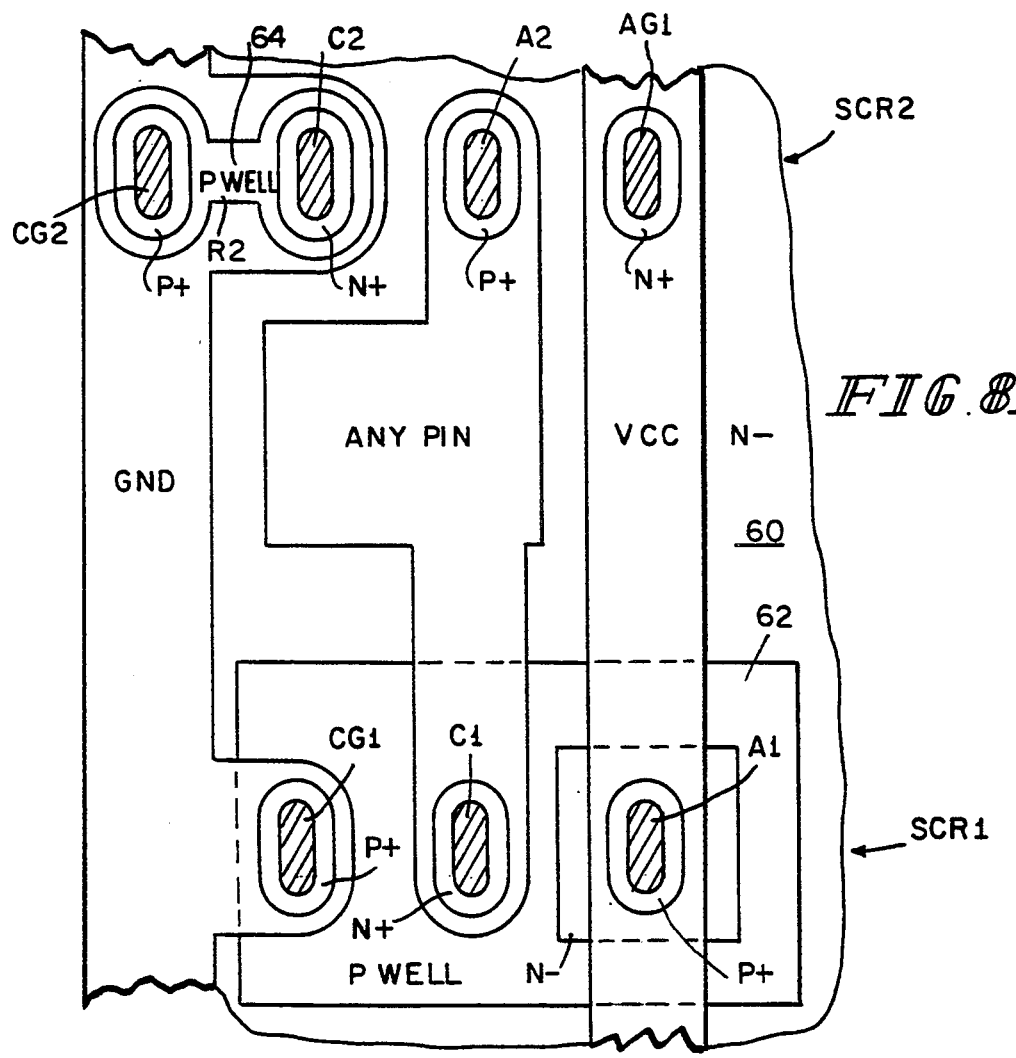
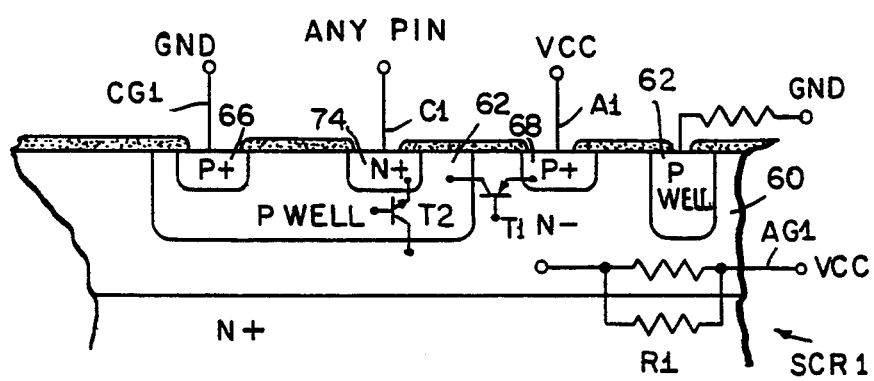

HIGH VOLTAGE PROTECTION USING SCRS

BACKGROUND AND SUMMARY OF THE INVENTION

The present invention relates generally to input and output protection of integrated circuits, and more specifically to an improved high voltage or electrostatic discharge (ESD) protection network for analog as well as digital integrated circuit devices.

The occurrence of voltage spikes, noise, or other undesirable high voltage signals on the input and outputs of integrated circuits is well known. The prior art has attempted to provide protection for these circuits by using one or more devices to provide current paths between the device pins and one or both voltage supplies to shunt destructive input signals. These destructive input signals are generally caused by electrostatic discharge. The input protection devices are generally used to protect sensitive circuit elements such as the gates of complementary insulated gate field effect transistors. These protection devices have included diodes, zener diodes, lateral bipolar transistors, resistor networks, auxiliary insulative field effect transistors and SCRs.

The use of lateral bipolar transistors for input protection in CMOS ICs is illustrated by U.S. Pat. No. 4,760,433. A resistor-diode input protection circuit which addresses the problem of latch up in CMOS circuits is shown in U.S. Pat. No. 4,143,391. An SCR, Q5 and Q6, is potentially formed at the output side of the input resistor. By designing the circuit without a resistor at the base of Q5, the SCR will not latch up. To prevent the formation of an SCR between the input resistor and the well in which one of the complementary transistors is formed, the base regions of transistors Q7 and Q8 are formed to a large enough length to produce a low current amplification factor or beta. Parasitic SCRs on the output and supply terminal include transistors Q1–Q4. Resistors R5 and R6 are selected to have a very low resistive value to prevent the SCR formed by Q1 and Q2 from latching. These low value resistors also prevent the parasitic SCRs connected to the output pin from latching. As with the parasitic input SCR, the betas are selected to prevent the parasitic transistors from having sufficient gain to latch the output or supply SCRs. U.S. Pat. No. 4,757,363 describes a guard ring used to prevent SCR formation in a CMOS process.

The use of SCRs as input protection devices is shown by a series of patents to Avery and include U.S. Pat. Nos. 4,400,711; 4,484,244; 4,567,500 and 4,595,941. In all of these circuits, the avalanche threshold or breakdown voltage of the SCR has to be high enough not to latch up under normal operating conditions, and the threshold is not altered when power is removed. Thus, these circuits do not provide a low level of threshold protection when the device is not powered up. Also, the leakage currents of the protection structures are not balanced with respect to the input and therefore may not be used with certain kinds of analog circuits. Similarly, the protection provided by these circuits is specifically from an input or output pin to a single supply. None of these circuits will accommodate ESD pulses between all possible pin combinations.

This problem is addressed specifically in U.S. Pat. No. 4,870,530. Between each pin and the substrate pin, an SCR and an anti-parallel diode is provided. This provides current paths in either direction between any pair of input, output, or substrate pins. However, it does not address pin combinations involving the positive supply. As with the Avery patents, the SCR must have a high enough threshold such that it does not latch up during normal operation while still protecting against ESD. Also, the design does not provide for a balance of leakage currents due to the addition of the protective circuitry. This further limits the type of circuits that may incorporate this protective technique.

One group of analog circuits whose performance may be affected by the addition of ESD protection devices are operational amplifiers. For example, Harris Semiconductor operational amplifier HA-5180 has an input bias current specification of one pico-amp or less at room temperature. This type of DC specification places a very stringent requirement on the DC characteristics of the protection circuit, since ideally the addition of a protection circuit should not degrade the original device characteristics. Similarly, added capacitance due to protection circuitry on the input or output terminals would affect an operational amplifier's AC characteristics. For example, Harris Semiconductor operational amplifier HA-2542 has a slew rate in the hundreds of volts per microsecond. This type of AC performance could be drastically degraded if the protection circuit added significant capacitance to certain pins, such as the compensation pin.

Thus it is an object of the present invention to provide an improved ESD protection circuit which will provide low level threshold protection when the circuit is not powered up and high level threshold protection once the circuit is powered up.

Still another object of the present invention is to provide a circuit with such threshold voltage protection features and which is not subject to latch up.

A still further object of the present invention is to provide an ESD protection circuit which can be used on digital as well as analog integrated circuits without effecting the DC or AC operating characteristics of the integrated circuit.

These and other objects are achieved by providing a high voltage protection circuit including a breakdown network connecting a first terminal to be protected and a supply terminal. The breakdown network has a first low threshold value when power is removed from the supply terminal. This allows the formation of a discharge path to occur at a low threshold voltage. In addition, the breakdown network also has a second threshold value higher than the first threshold value when power is applied to the supply terminal. This prevents the formation of a discharge path during normal operation of the circuit to be protected. Thus the network has a lower threshold value when the circuit to be protected is not powered up than it does when the circuit is powered up.

The protection circuit includes anti-latching circuitry connected to the breakdown network for preventing the breakdown network from latching on after or during the time power is applied to the positive and negative terminals. Thus, although the network may come on to provide some ESD protection, it will not latch on when the circuit to be protected is powered.

The breakdown network includes a plurality of diodes and SCRs connecting the first terminal, the positive terminal and the negative terminal. These devices provide protective current paths through forward biased diodes or SCRs for any combination of signals on the first, positive and negative terminals while power is not present on the positive and negative terminals. The leakage current between the first terminal and the positive terminal, and between the first terminal and the negative terminal are of opposite polarity and thus cancel each other while power is applied to the positive and negative terminals. This cancellation effect prevents the ESD protection circuit from altering the normal DC operating characteristics of the first terminal. The breakdown network includes a first SCR having an anode and anode gate connected to the positive terminal, a cathode connected to the terminal to be protected and a cathode gate connected to the negative terminal. The breakdown network also includes a second SCR having a cathode and cathode gate connected to the negative terminal, an anode connected to the terminal to be protected and an anode gate connected to the positive terminal. Thus each SCR is connected in such a manner that it could provide a conduction path for an ESD pulse between two pins. However, this conduction path is prevented from forming by the voltages applied to the gates once the power terminals are activated.

A first resistor connects the anode gate of the first SCR to the positive terminal and a second resistor connects the cathode gate of the second SCR to the negative terminal. The value of the resistors are selected to prevent the respective SCR from turning on when power is applied to the positive and negative terminals while permitting the SCR to turn on when power is removed from the positive and negative terminals. The first and second resistors are either fixed resistors or variable value resistors. A variable value resistor would have a higher resistive value when the power is removed from the positive and negative terminals than the resistive value when power is applied to the positive and negative terminals. The variable resistor could be a field effect transistor having a source drain path connected in series with the gate of the SCR and its gate connected to one of the power terminals.

A first diode can be added having its anode connected to the first SCR's cathode and its cathode connected to the terminal to be protected. Also a second diode can be added having its anode connected to the terminal to be protected and its cathode connected to the second SCR's anode. This increases the breakdown voltages from the positive supply to the first terminal and the first terminal to the negative supply.

A third SCR may be included having a cathode and anode gate connected to the positive terminal, an anode connected to the terminal to be protected and a cathode gate connected to the negative terminal. Also a fourth SCR can be included having a cathode connected to the terminal to be protected, an anode gate connected to the positive terminal and an anode and cathode gate connected to the negative terminal. A common first resistor connects the anode gate of the first and third SCRs to the positive terminal and a second common resistor connects the cathode gate of the second and fourth SCRs to the negative terminal.

To prevent the first SCR from latching on when power is applied to the power terminals, a device is connected between the cathode and cathode gate of the first SCR; and to prevent the second SCR from latching when power is applied to the power terminals, a second device is connected between the anode and anode gate of the second SCR. These devices are respectively a first diode having a cathode connected to the terminal to be protected and an anode connected to the negative terminal and a second diode having a cathode connected to the positive terminal and an anode connected to the terminal to be protected. The diodes may be common P-N diodes, Schottky diodes, or portions of bipolar or MOS transistors.

An ESD protection circuit may be a portion of the integrated circuit of the terminal to be protected or a portion of a second integrated circuit sharing a common housing with the circuit to be protected. A plurality of integrated ESD protection circuits may be provided within the housing for a plurality of leads to be connected. Alternately, the ESD protection circuit may be in its own housing with its external leads connected to the leads of a first housing including the circuit to be protected.

Other objects, advantages and novel features of the present invention will become apparent from the following detailed description of the invention when considered in conjunction with the accompanying drawings.

BRIEF DESCRIPTION OF THE DRAWINGS

FIG. 8A is a topological view of an integrated circuit incorporating the ESD protection circuit of the present invention using P well CMOS fabrication;

FIGS. 8B and 8C are cross-sectional views of an integrated circuit incorporating the protection circuit of the present invention using P well CMOS fabrication;

DETAILED DESCRIPTION OF THE INVENTION

Figure 1:
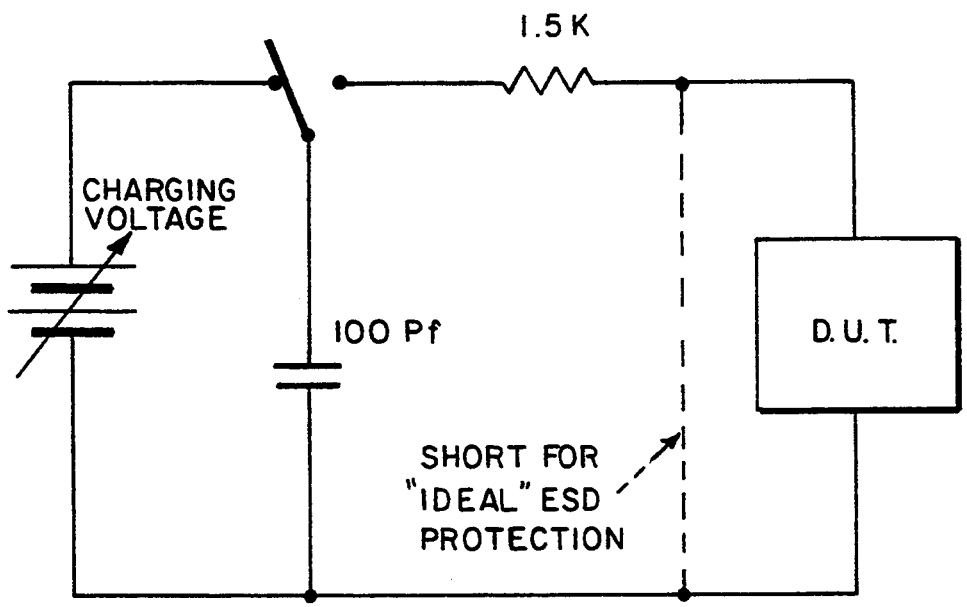
FIG. 1 is a schematic of an ESD human body test circuit.

The "human" model used for ESD testing is a 100 pf capacitor charged to the desired voltage and then discharged across the device pins through a 1.5K ohm series resistor as illustrated in FIG. 1. The ideal ESD protection would be a zero ohm short between the pins of the DUT (Device Under Test). If the pins were all shorted together, all of the energy stored in the charged capacitor would be dissipated in the 1.5K ohm series resistor and none on the die. If no power is dissipated on the die, no components will be damaged. However, permanently shorting all the device pins together will not allow the device to function properly.

The present protection circuit addresses both the protection and the functional concerns by using the DC voltage applied to the supply terminals to regulate the threshold voltage at which the low impedance discharge paths will be created between certain device terminals. This threshold voltage increases as the device is powered up, such that when the device is fully powered up, the threshold is outside the normal range of operating voltages and therefore the low impedance paths will not be formed. In the preferred embodiment, the ESD circuit will assure protection through the low impedance paths when the device is not powered up and still not interfere with normal operation when the device is powered up.

Figure 2A:
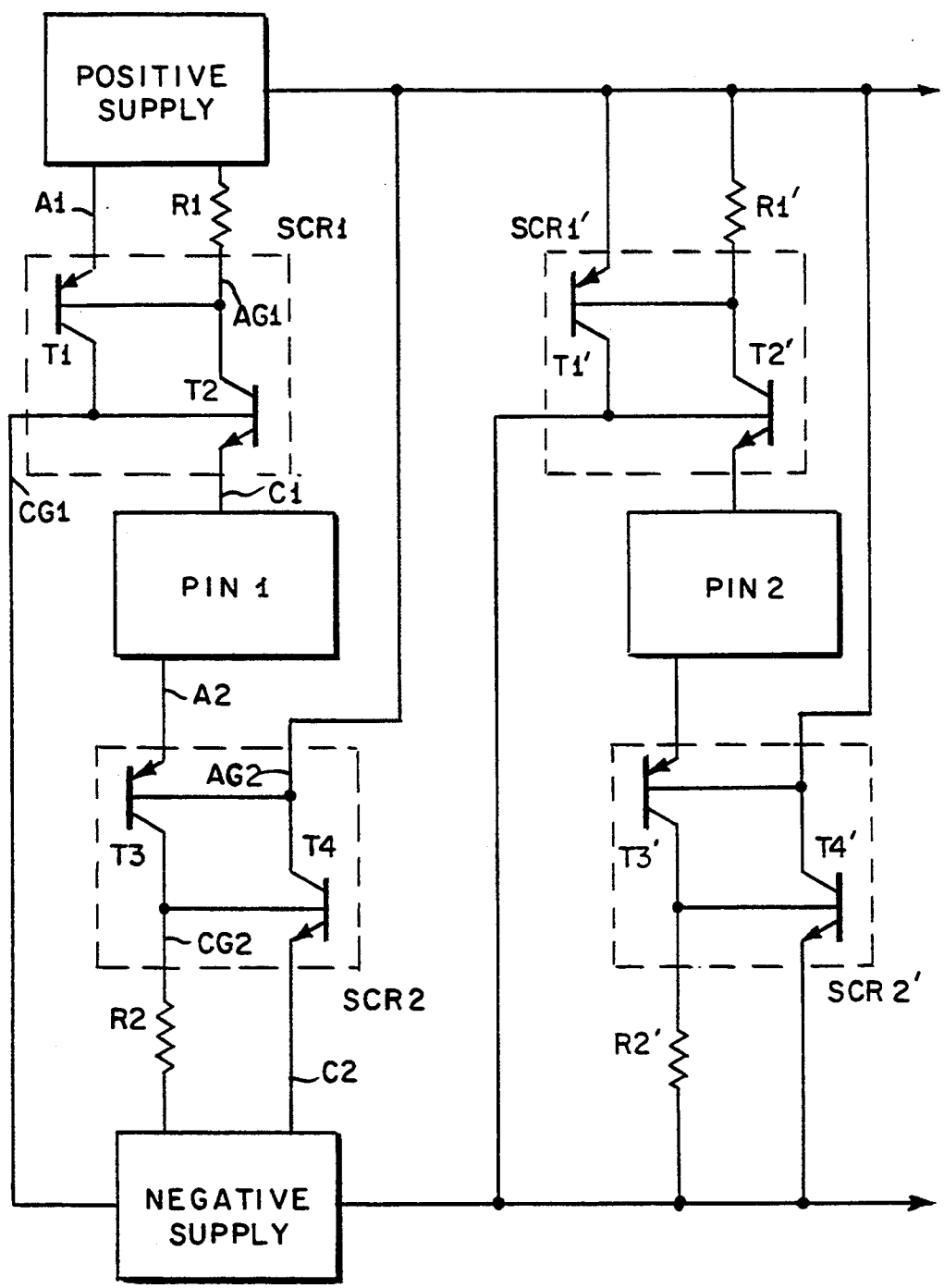
FIGS. 2A and 2B are basic schematics of a protection circuit for a pair of pins according to the principles of the present invention showing the SCR as transistors and four layer devices respectively.

A first preferred embodiment of the invention is illustrated in FIG. 2A as including a first silicon controlled rectifier SCR1 and a second silicon controlled rectifier SCR2. The SCRs are illustrated as appropriately interconnected bipolar PNP and NPN transistors T1, T2 and T3, T4 wherein the anode is the emitter of the PNP transistor, the anode gate is the common base of the PNP transistor and the collector of the NPN transistor, the cathode gate is the common collector of the PNP transistor and the base of the NPN transistor, and the cathode is the emitter of the NPN transistor.

Figure 2B:
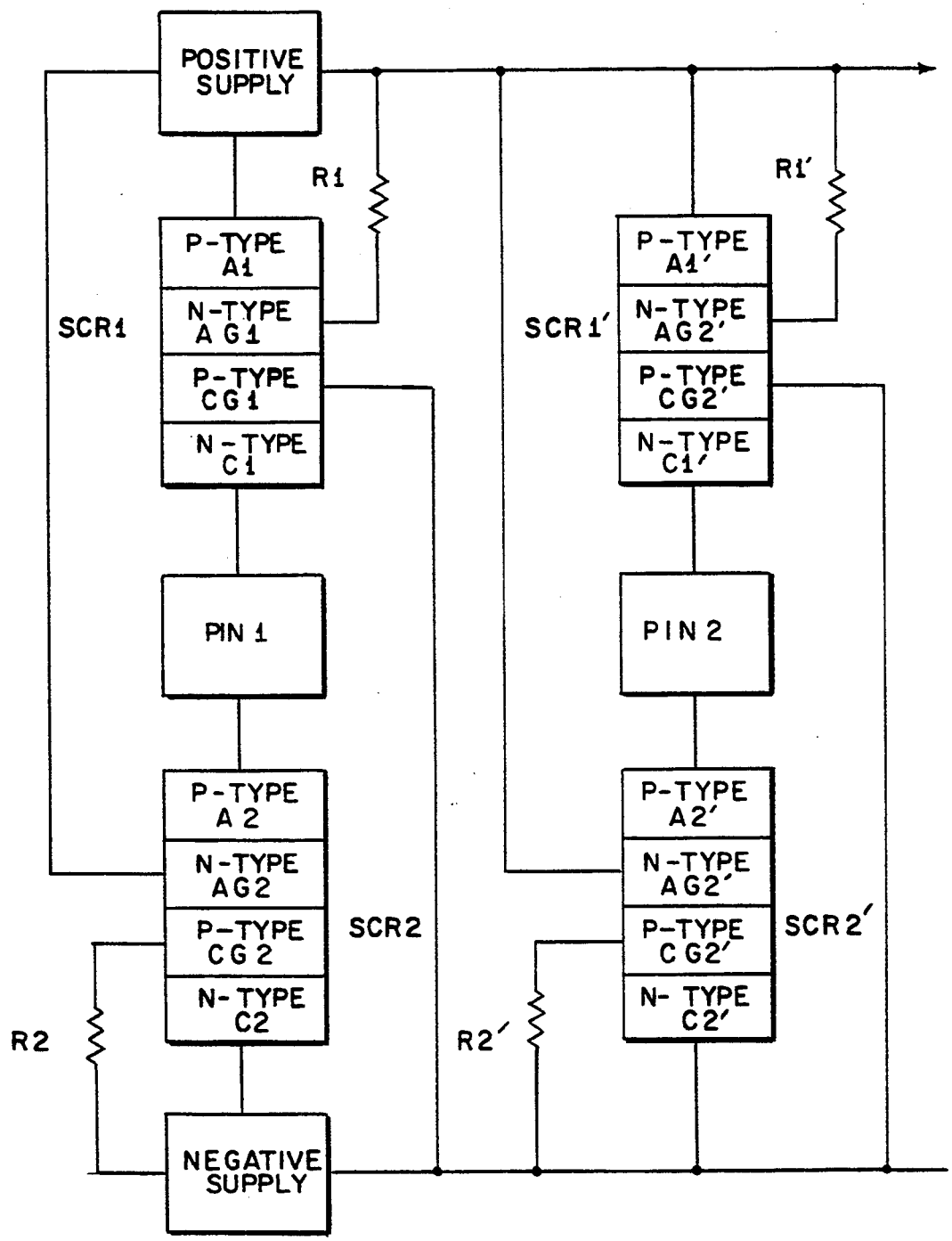

FIG. 2B illustrates the circuit of FIG. 2A with the SCRs schematically shown as devices comprising four semiconductor layers of alternating conductivity types. For the first SCR, SCR1, the P-type anode layer A1 and the N-type anode gate layer AG1 are connected to the positive power supply. The n-type cathode layer C1 is connected to the terminal PIN1 and its cathode gate CG1 connected to the negative power supply. A second SCR, SCR2, is shown having its P-type anode layer A2 connected to the terminal PIN 1, its N-type anode gate layer AG2 connected to the positive power supply, and its N-type cathode layer C2 and P-type cathode gate layer CG2 connected to the negative power supply. Resistor R1 connects the anode gate AG1 to the positive power supply and a second resistor R2 connects the cathode gate CG2 to the negative power supply. The role of all these circuit elements as a breakdown network will be explained in more detail below. The SCRs provide a low impedance breakdown path, while the resistors control the conditions under which the low impedance path will be formed.

FIGS. 2A and 2B also illustrate a pair of SCRs, SCR1' and SCR2' and resistors R1' and R2' configured to protect second terminal PIN2 using a circuit identical to the protection circuit connected to terminal PIN1. The internal device circuitry that needs the protection (not shown) is also connected to the positive and negative power supply terminals as well as terminals PIN1 and PIN2.

SCRs are well known fairly low impedance switches that can be triggered into conduction with relatively small current applied to either the anode gate or the cathode gate. Each circuit of FIGS. 2 provides a breakdown network connecting the terminal to be protected with the positive and negative power supplies. This network protects the terminal PIN by providing a conductive discharge path for an ESD pulse when the breakdown threshold is exceeded. The interconnection of SCR1 and SCR2 has a first threshold value while power is not supplied to the positive and negative supply terminals, and has a second threshold value higher than the first threshold value while power is applied to the positive and negative terminals.

The following is an example of how the protection circuit illustrated in FIGS. 2A and 2B would provide a low impedance discharge path during an ESD event. This example assumes the device is not powered up. If a large rapid rising positive voltage pulse was applied from the terminal PIN1 to the negative supply terminal, the SCR2 would be triggered to provide the needed discharge path. The triggering of SCR2 would be caused by two different effects. The first effect results from the magnitude of the voltage spike being applied across the anode and cathode of SCR2. Once this spike reaches the avalanche voltage of the SCR2, the SCR will latch up and start to conduct. The second effect, perhaps of greater significance, is the rapid rise rate, dv/dt, of the ESD pulse. A large positive dv/dt across the anode and cathode of the SCR2 will cause a large dv/dt across the anode gate to cathode gate junction. This junction has a certain capacitance associated with it. Therefore, there will be a large dv/dt across this junction capacitor, thus causing a current to flow through the capacitor. The current induced through the anode gate to the cathode gate junction capacitor acts as gate current for both gates and cause the SCR2 to latch up and start conducting. Once the SCR2 is latched, it provides a very low impedance path to shunt the current and clamp the voltage produced by the ESD pulse. With the voltage across the device pins clamped, most of the voltage due to the ESD pulse appears across any external resistance, e.g., the resistor of the FIG. 1 test circuit. Most of the power due to the ESD pulse will be dissipated externally and the device will therefore be protected.

Since an ESD can occur randomly between any combination of pins, and with either voltage polarity, it is important that the ESD protection circuit provide low impedance discharge paths between all possible pin combinations. In the circuit of FIGS. 2, these low impedance discharge paths do not always require latch-up of an SCR (see Table 1). The low impedance discharge paths include conduction through forward biased diodes as well.

TABLE 1

| PIN COMBINATION FOR DISCHARGE POLARITY | | |
|---|---|---|
| + | − | LOW IMPEDANCE PATH |
| PIN 1 to NEG. SUPPLY | | SCR2 on PIN 1 |
| NEG. SUPPLY to PIN 1 | | Base-emitter diode of T2 on PIN 1 |
| PIN 1 to POS. SUPPLY | | Base-emitter diode of T3 on PIN 1 |
| POS. SUPPLY to PIN 1 | | SCR1 on PIN 1 |
| POS. SUPPLY to NEG. SUPPLY | | T1 and T4 on all pins will be turned on by the large DV/DT across the B-C capacitor. |

TABLE 1-continued

| PIN COMBINATION FOR DISCHARGE POLARITY | | |
|---|---|---|
| + | − | LOW IMPEDANCE PATH |
| NEG. SUPPLY to POS. SUPPLY | | B-E diode of T2 on PIN 1 in series with B-E diode of T3 of PIN 1 in parallel with all other pins. |
| PIN 1 to PIN 2 | | SCR2 on PIN 1 and the B-E diode of T2' on PIN 2 in parallel with the B-E diode of T3 on PIN 1 in series with SCR1' of PIN 2 |
| PIN 2 to PIN 1 | | Same as above only switch pin numbers. This applies to any number of pins. |

For example, when a negative polarity pulse is applied between PIN 1 and the negative supply, which is the second entry in Table 1, the low impedance path will be through the forward biased base-emitter diode of T2.

Although the ESD circuit can protect all pin combinations when the SCRs are enabled, i.e. when the power is off, the ESD circuit does not interfere with the normal operation or performance of the device when the power is applied. When power is applied, the base of T3 is biased at the positive supply voltage and the base of T2 is biased at the negative supply voltage. This biasing effectively prevents the SCRs from triggering by robbing all the base current from T2 and T3, or in other words, preventing the base-emitter junctions of T2 and T3 from being forward biased. This is true so long as the voltage on the Pin is kept at some level between the positive supply plus the base-emitter voltage of T3 and the negative supply minus the base-emitter voltage of T2. If the pin is pulled more than a diode drop above the positive supply or a diode drop below the negative supply, the SCR in question will turn on and attempt to clamp the voltage on the pin. Whether or not, the SCR would turn off again once the voltage on the pin is brought back into the normal operating range is dependent on the betas of the transistors and the resistance in the lines connecting the anode and cathode gates to the positive and negative supply terminals. If the SCRs were designed so they would not sustain latchup, this circuit would also provide protection against over voltage conditions while the device is operating. This situation could occur if one of the input or output pins was driven to a voltage outside the range of the supply voltages.

The collector-base leakage current on T1, T2, T3 and T4 could provide base current for transistor T1 and T4. This base current could cause collector current to flow in these transistors increasing the supply current significantly. In addition, this base current could cause unwanted latchup of the SCRs. To prevent this, resistor R1 is connected between the anode gate AGI and the positive supply terminal; and resistor R2 is connected between the cathode gate CG2 and the negative supply terminal. These resistors R1 and R2 drain off this leakage current and maintain a low voltage across the base-emitter junctions of T1 and T4. The values of these resistors need to be low enough to prevent T1 and T4 from turning on when the device is powered up, but not so low as to prevent the triggering of the SCRs once the power is removed. A typical value for each resistor could range from 1K to 20K ohms, however, it would depend greatly on the process and the device layout.

Figure 3:
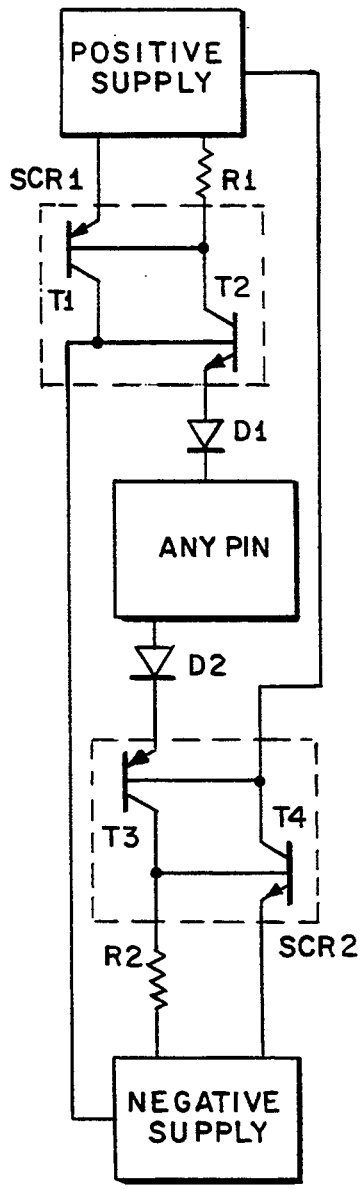
FIG. 3 is a schematic of a first modification of a protection circuit according to the principles of the present invention.
Figure 7:
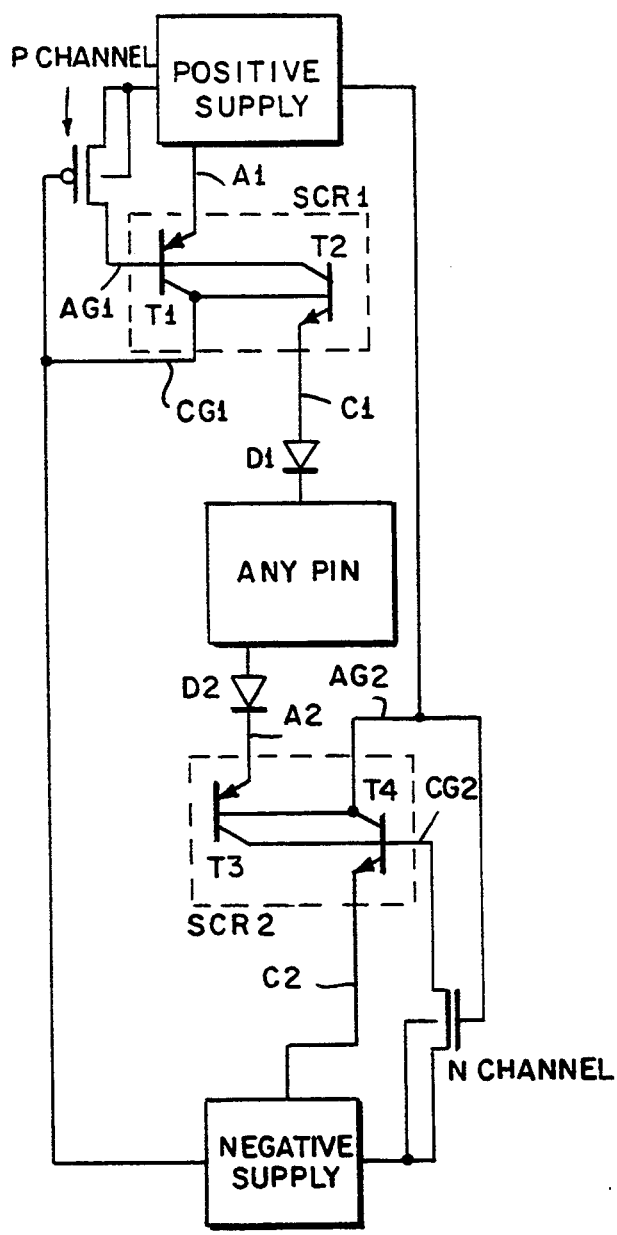
FIG. 7 is a third modification of the protection circuit of FIG. 3 incorporating variable resistances.
Figure 9:
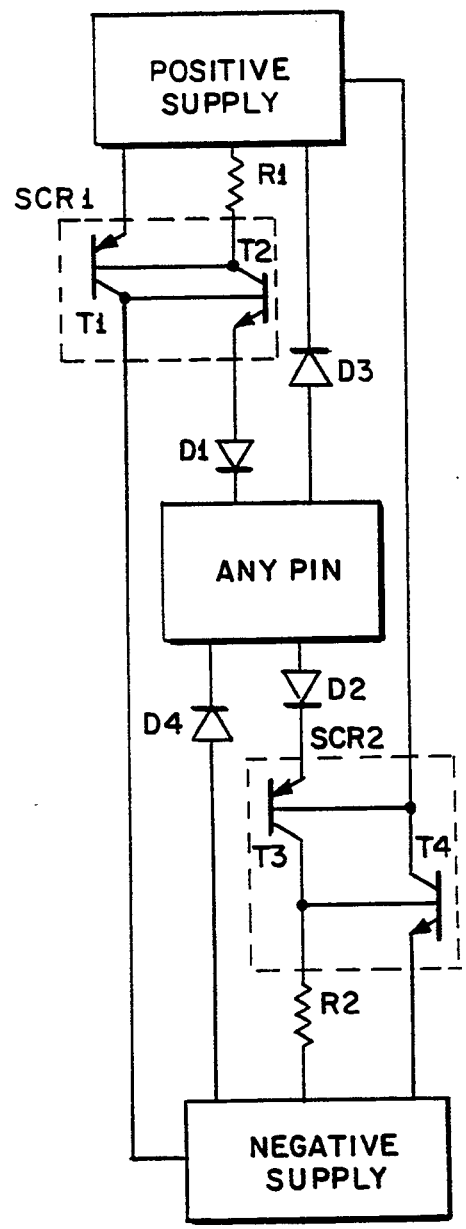
FIG. 9 is a schematic of protection circuit having anti-latchup protection according to the principles of the present invention.

Another concern is junction breakdown. Once the device is powered up, the terminal to be protected could be pulled to any voltage within the supply voltage range. In the case of an operational amplifier with ±15 volt supplies, there could be a 30 volt delta across the base-emitter terminals of T2 and T3, the base-collector terminals of Q1, Q2, Q3 and Q4 and the collector-emitter terminals of Q1, Q2, Q3 and Q4. When these devices are laid out in an integrated circuit, it is important that only junctions with high breakdown voltages are used in these locations. If layout or performance considerations make it impossible to do this with vertical structures, lateral structures can be used. In addition, if the base-emitter breakdown voltages of T2 and T3 pose a problem, high breakdown diodes can be put in series with both emitters to drop the voltage as shown in FIGS. 3, 7, 9 as D1, D2 and T5.

In the case of an operational amplifier, the base-emitter leakage current on T2 and T3 can affect the input bias currents. This effect can be reduced greatly if the leakage currents of the two base-emitter junctions are matched. The currents would cancel each other out, because one junction is providing current to the input, while the other junction is receiving an equal current from the input. To match these leakage currents, it is preferred to make the base-emitter junctions of T2 and T4 out of the same diffusion regions and of the same size and shape to match their junction areas. It would also improve the current match if the two junctions were located as close as possible to each other on the die.

An example is shown in FIGS. 4A-4D. SCR1 and SCR2 are formed respectively on a layer of bulk semiconductor material 10 in one of two electrically isolated islands 12 and 14 respectively that are isolated from the substrate 10 by a dielectric layer 16. The buried layers 18 and 20 formed in the same process step are provided in islands 12 and 14 respectively. Using a P collector processing step, P region 22 is formed in island 12 and P regions 24 and 26 are formed in island 14. Using a P base processing step, P region 32 is formed in P region 26 and N substrate 14. Using an N base processing step, N region 36 is formed in P region 22. Using a P emitter or contact processing step, P+ region 40 is formed in P region 22, P+ contact 42 is formed in N region 36, P+ contact 44 is formed in P base region 32 and P+contact 46 is formed in P region 24. Using an emitter or contact processing step, N+ region 48 is formed in N region 36, N+ region 50 is formed in N substrate 12, N+ region 52 is formed in P region 32 and N+ region 54 is formed in N substrate 14.

The base-emitter junction of T2 is formed between the P region 22 and the N substrate 12. This is to be matched to the base-emitter junction of T3 which is between the P region 24 and the N substrate 14. It is noted that P regions 22 and 24 are both formed using the same process steps and therefore will have the same impurity concentration and distribution. The P region 24 is added to SCR2 to match the junction geometries and thereby match leakage currents associated with SCR1 and SCR2. FIGS. 4B and 4D will illustrate connection of the positive and negative terminals V+ and V− to power busses extending throughout the integrated circuit. The connection to the pin to be protected is through its bond pad (not illustrated).

If different diffusions are used because of process or layout limitations, the leakage currents can be matched by proportioning the junction areas. However, this method may not result in a satisfactory current match, and it would be more process sensitive. One solution would be to incorporate series diodes such as shown in FIG. 3. By forming high breakdown diodes with the same geometry from the same diffusion regions and placing these diodes in series with the emitters of T2 and T3, both the breakdown problem and the problem of matching leakage currents will be solved.

It is well known that the AC performance of an integrated circuit will be degraded as capacitance is added to the input and output terminals. The added capacitance due to the present protection circuit can be minimized in several ways. For example, because most of the energy from an electrostatic discharge will be dissipated in the external resistor, the protection circuit can be made from very small devices with fairly low capacitance.

This AC performance characteristic is enhanced by the ability of the present protection circuit to increase the breakdown threshold voltage when power is applied to the supply terminals. While the device is powered down the protection circuit can operate at a breakdown threshold voltage significantly lower than the normal operating voltage of the circuit to be protected. With this low-voltage protection in the powered down mode, during a discharge event a lower percentage of the power from an ESD pulse will be dissipated in the protection circuit and a higher percentage of the power will be dissipated external to the circuit. As a result of this low power dissipation characteristic, the junction areas of the SCR's and any circuit diodes can be made significantly smaller. Smaller junction areas equate to lower capacitance.

Since the present ESD circuit employs a technique to vary the threshold based on what voltage is present on the supply pins, this circuit can have threshold voltages an order of magnitude smaller than the protection circuits described in the prior art. With this achievable reduction in junction areas, the capacitance of the present circuit can also be reduced by an order of magnitude smaller. This large reduction in capacitance makes the present protection circuit significantly more attractive for use in high frequency circuits and in other applications where the capacitance on certain device pins must be kept extremely small such as the bandwidth compensation pin of an operational amplifier.

If series diodes are used as shown in FIG. 3, the capacitance will be further reduced by placing two capacitors in series. Also, when the device to be protected is to the input or output terminals are reverse biased, and reverse biased diodes having much lower capacitance than forward biased diodes, have minimal effect on the operating characteristics.

Transient behavior, e.g., the response to rapid voltage changes, is an important operating characteristic. When the device is powered up, the base-emitter diodes of T2 and T3 are reverse biased. However, they can still act as coupling capacitors. If a rapid rising or falling signal is applied to the terminal PIN1, the signal will tend to be coupled onto the bases of T2 and T3 through this junction capacitance. The supply connection to these bases will tend to attenuate this signal. However, if there is too much inductance or resistance in these supply lines the DV/DT may provide enough transient base current to cause the unwanted triggering of one of the SCRs. There are several ways to minimize this effect. First, keep the impedance of the supply lines low. Also, by decreasing the value of R1 and R2, it is harder for the SCRs to trigger. A third way would be to add extra capacitance on the supply lines close to the bases of T2 and T3. This capacitance will tend to attenuate the signal, and the series impedance would be minimized due to the close proximity of the capacitors.

Figure 5:
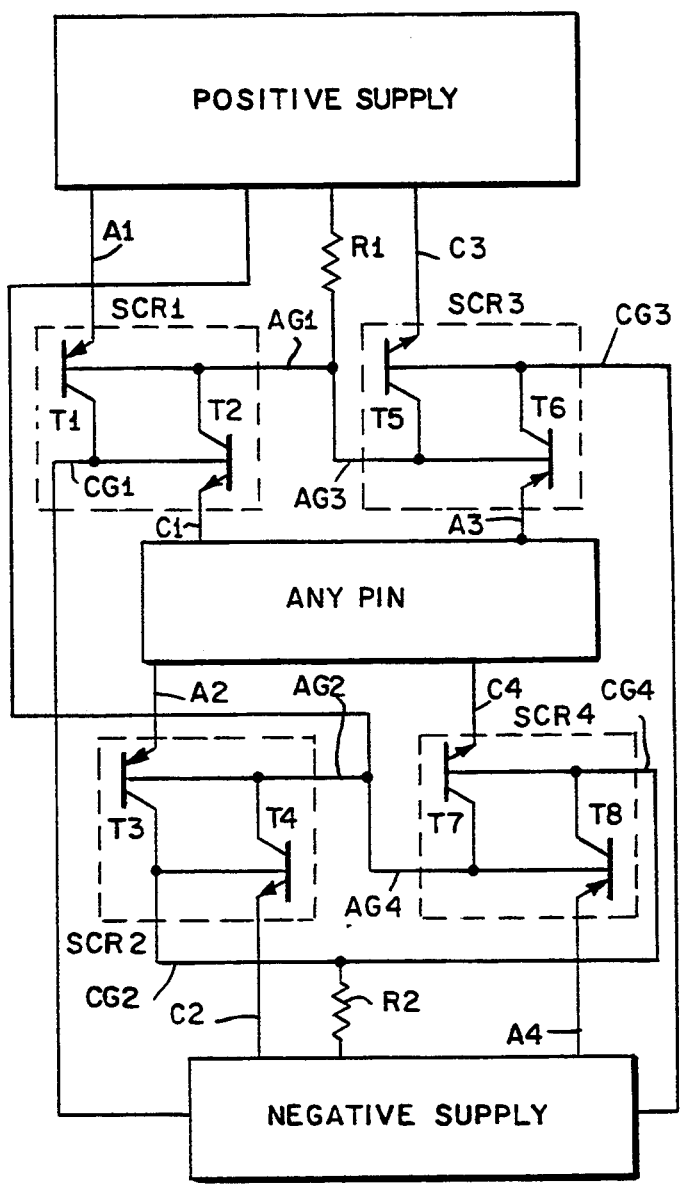
FIG. 5 is a second modification of a protection for the present invention.

A review of Table 1 will indicate that many of the various discharge paths are through forward biased diodes as well as SCRs. Since the on resistance of an SCR is lower than that of a diode, improved voltage clamping could be achieved if discharge paths were formed exclusively through SCRs. Improved voltage clamping would afford a higher level of protection. The schematic shown in FIG. 5 shows one way this could be achieved. In FIG. 5, SCR3 is connected anti-parallel to SCR1 between the terminal to be protected and the positive supply. In addition, SCR4 is connected anti-parallel to SCR2 between the terminal to be protected and the negative supply. R1 is a common resistor to the anode gates AG1 and AG3 of SCRs 1 and 3. Similarly, resistor R2 is a common resistor for the cathode gates CG2 and CG4 of SCRs 2 and 4. Since the on resistance of an SCR will be significantly lower than a diode, this circuit variation would act as a better voltage clamp for negative polarity ESD pulses. This translates into less power from an ESD pulse being dissipated on the chip and more power being dissipated in the external series resistance. As in the previously described circuits, all the SCRs are held off during normal operation by either direct or resistive connection of the gates to one or the other of the supply terminals.

The circuit of FIG. 5 also includes a leakage current cancellation feature since two of the base-emitter diodes, T2 and T7 will leak current to the pin to be protected and two base emitter diodes of T3 and T6 will leak current off the pin. It should be noted, that it may be more difficult to achieve current cancellation with this circuit option because four currents need to be summed to zero instead of just two. Another possible disadvantage would be that greater capacitance is added on the pin to be protected due to the additional two diodes.

Figure 6:
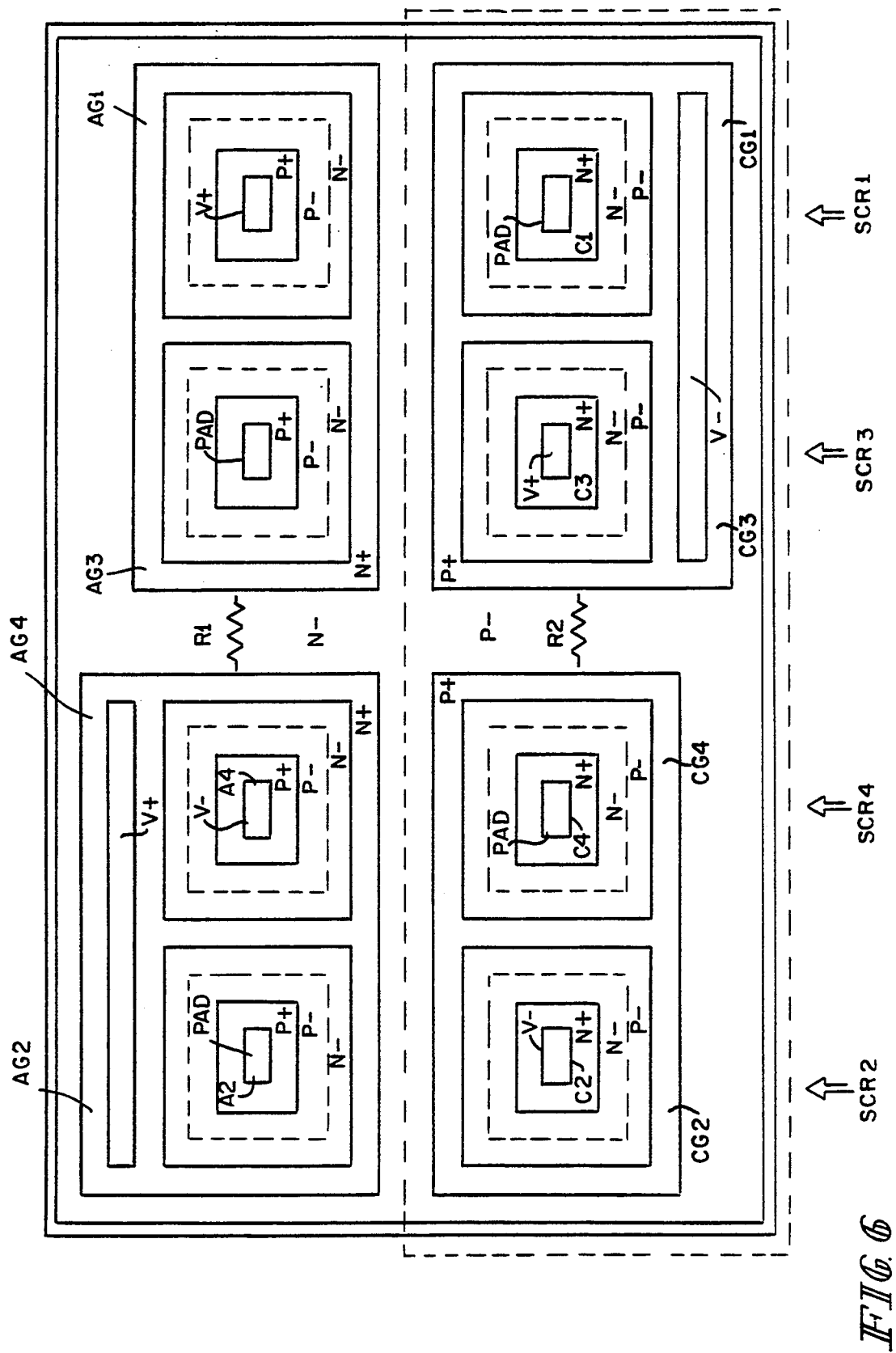
FIG. 6 is a topological view of an integrated implementation of the circuit of FIG. 5.

One possible integrated circuit layout of the FIG. 5 schematic is illustrated in FIG. 6. This includes the four SCRs, SCR1-SCR4 formed in a single dielectric isolated tub. The SCRs are made from lateral devices to achieve high base-emitter breakdown. The anode gates AG1-AG4 share a common N well region as do the cathode gates CG1-CG4 share the same P well region. While the anode gates AG2 and AG4 are connected directly to the plus supply terminal, the anode gates AG1 and AG3 are connected through the common N well region, which provides a diffused R1 resistor. Similarly, cathode gates CG1 and CG3 are connected directly to the negative supply voltage whereas the cathode gates CG2 and CG4 are connected through the common P well region to form the diffused R2 resistor. The four base to emitter junctions of transistors T2, T3, T6 and T7 are junctions between N regions and P regions. This produces the current match and cancellation. FIG. 6 is compatible with a dielectric isolated complementary bipolar process. Various other layouts are possible for more generic bipolar processes.

Instead of the fixed resistors R1 and R2, variable resistors may be used. As illustrated in FIG. 7, R1 is replaced by a P channel device having a source-drain path connected between the positive terminal and the anode gate AG1 of SCR1 and its gate connected to the negative supply. Similarly, R2 is replaced by an N channel device having its source-drain path connected between the cathode gate CG2 of SCR2 and the negative supply and its gate connected to the positive supply. In this connection, the P and N channel devices form a conductive channel between the positive and negative supplies and the anode and cathode gates respectively and cut off the resistive connection when power is removed. Thus when power is applied to the positive and negative supplies, the ESD protection circuit will operate as in the previous figures except that the standard resistors are replaced by the resistive channels of the MOS devices. Thus the MOS devices provide the lowest possible resistance when the circuit is powered up to maintain the SCRs off or disabled while providing a much larger resistance during the time power is not present to keep the thresholds of the SCRs as low as possible to provide better ESD protection. Thus the MOS devices replace a fixed resistor with a variable resistor that is dependent upon the power supply. Although FIG. 7 shows resistors R1 and R2 being replaced in the embodiment of FIG. 3, it is also applicable to the circuit of FIGS. 2 and 5.

While bipolar implementation is shown in FIGS. 4 and 6, a possible layout for a CMOS integrated circuit fabrication process is illustrated in FIGS. 8A–8C. The example shown uses a P well process, however similar structures can also be made using N well and twin tub processes. An N substrate 60 has P wells 62 and 64 therein to form the cathode gates of SCR1 and SCR2 respectively. P+ region 66 in P well 62 forms the cathode gate contact CG1, P+ region 68 in the N substrate forms the anode A1 for SCR1. P+ region 70 in the P well 64 forms the cathode gate contact CG2 and P+ region 72 in the N substrate 60 forms the anode A2 of SCR2. N+ region 74 in the P well 62 forms the cathode C1 of SCR1. N+ region 76 in P well 64 forms the cathode C2 and N+ region 78 in the substrate 60 forms the anode gate contact of SCR2.

P+ anode region 72, N-anode gate substrate 60, P well cathode gate region 64 and the N+ cathode region 76 of SCR2 are located in close proximity to each other to increase the betas of the two bipolar transistors forming the SCR. This same close proximity of the various regions is also used on SCR1. This improves the turn on characteristics of the SCR, which increases their efficiency as protection devices. As can be seen from FIG. 8A, resistor R2 was formed by the P well 64 and is necked down between the portion in which the N+ cathode region 76 is formed and the P+ cathode gate contact 70. SCR1 is formed by the P+ anode region 68, the N-cathode gate region 60, the P well cathode gate region 62 and the N+ cathode region 74. Since the substrate 60 is connected directly to VCC by the anode gate contact for SCR2, which is also the anode gate for SCR1, the series resistance R1 between the anode gate, which is the substrate region 60 surrounding region 68, and VCC is provided by the internal resistance of the substrate 60. P ring 62 surrounds the P+ anode region 68 pinching the substrate resistance to increase its value. Also the distance between N+ contact 78 and P+ 68 will add to the value of the resistance.

Figure 4A:
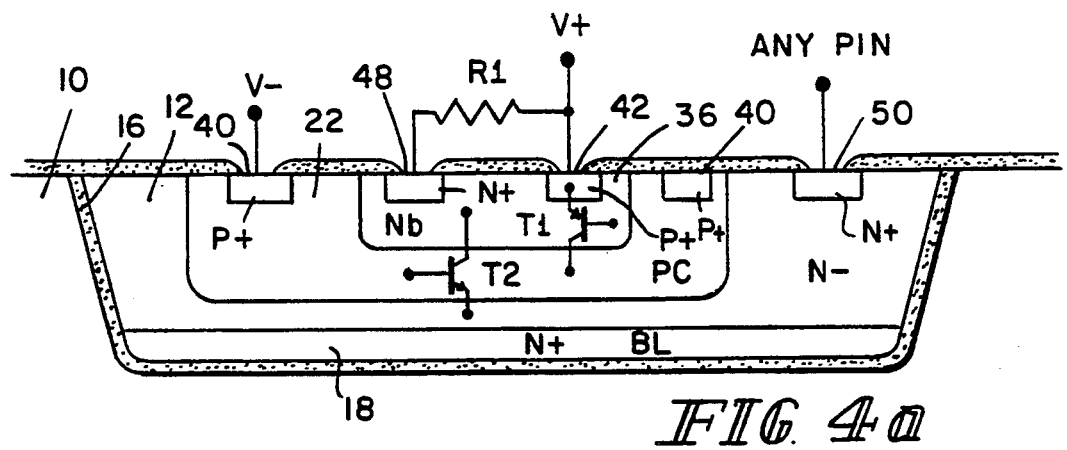
FIGS. 4A and 4C are cross-sectional views of a protection circuit of SCRS 1 and 2 respectively according to the principles of the present invention using dielectric isolated bipolar fabrication.
Figure 4B:
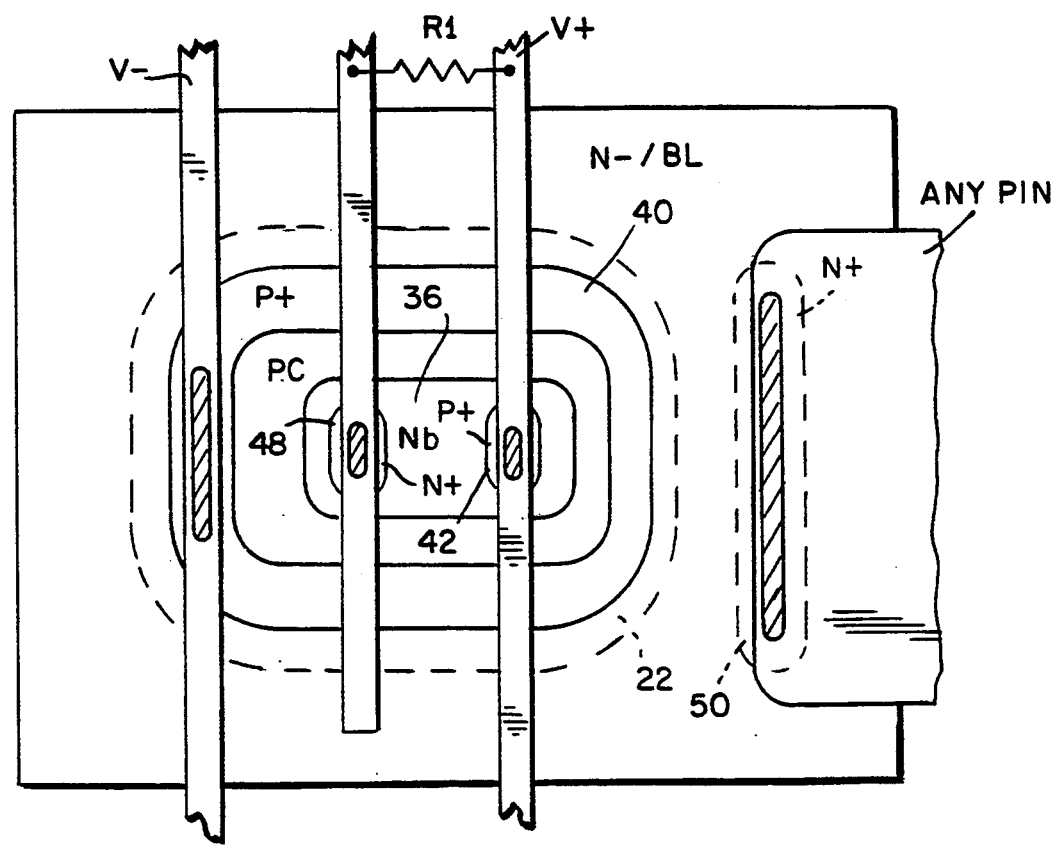
FIGS. 4B and 4D are topological views of a protection circuit of SCRS 1 and 2 respectively according to the principles of the present invention using dielectric isolated bipolar fabrication.
Figure 4C:
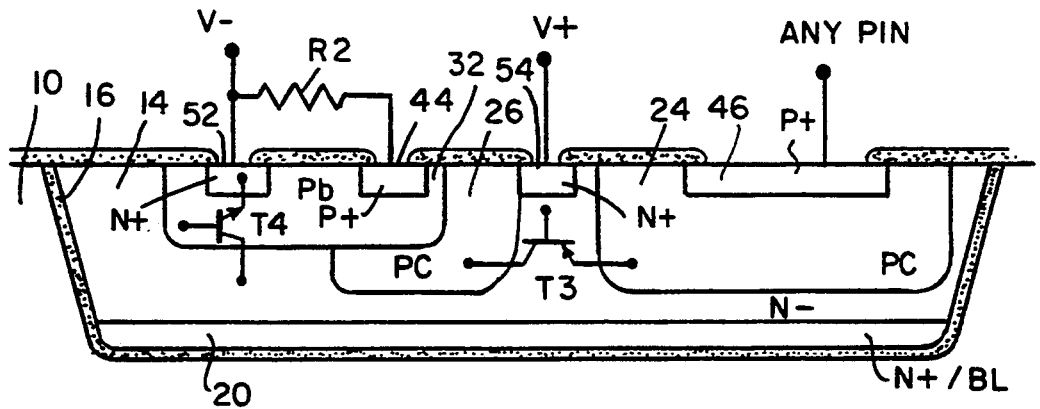
Figure 4D:
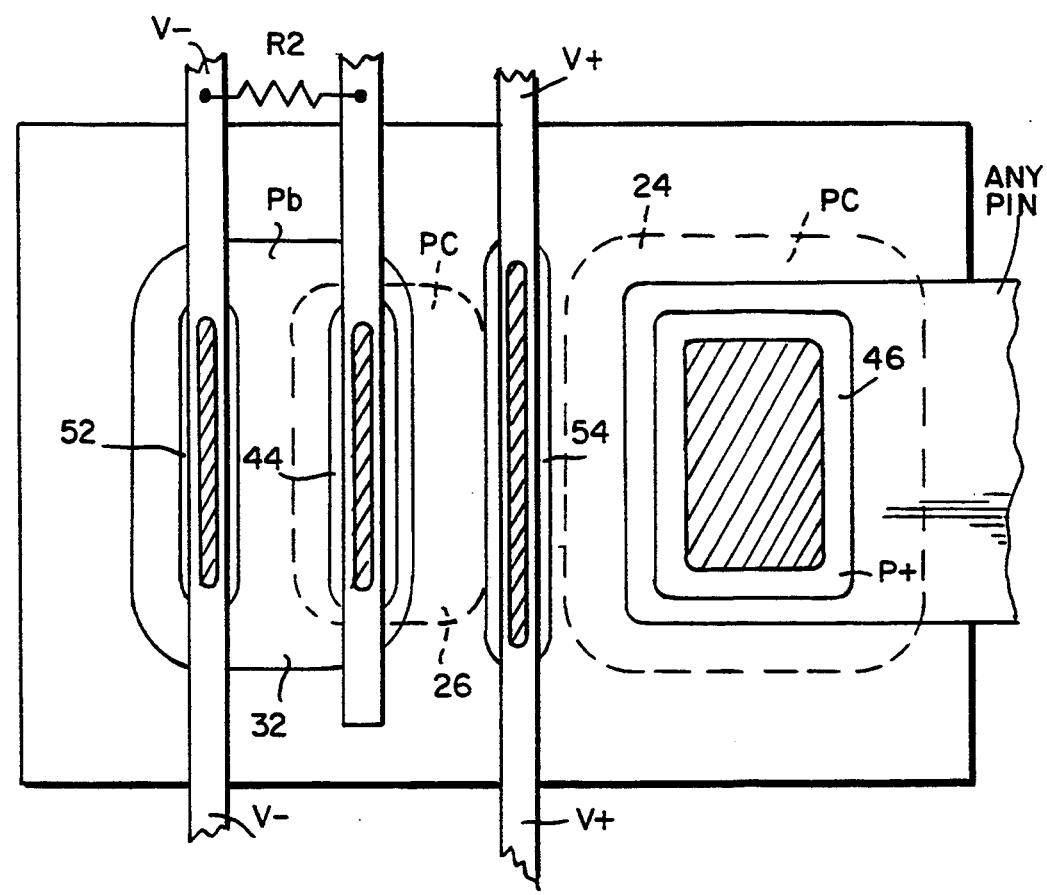

It should be noticed that the difference between FIGS. 8A and 4A is that in FIG. 8A the bonding pad is between the positive and negative or VCC and ground bus lines wherein in FIG. 4A, the bonding pad is adjacent to and interior to the power supply busses. Also, the positive supply in CMOS is VCC and the negative supply is ground or VDD, while the bipolar notation is V+ and V−.

The paired SCR ESD protection circuit seen in FIG. 2 provides a low impedance discharge path for ESD while the device is not powered up, and does not interfere in normal operation while power is applied. However, there are a few applications where this protection circuit may interfere with normal operation. For example, if a positive voltage was present on the terminal to be protected prior to the power supplies being brought up, SCR2 will latch on and possibly stay on even after the supplies reach their final voltages. This latching would occur because the base- emitter diode of transistor T3 is initially forward biased due to the positive voltage on the terminal and the positive supply starting out at ground. This situation could occur if the terminal was being supplied by some other device or source that received power before the protected device did.

Figure 4E:
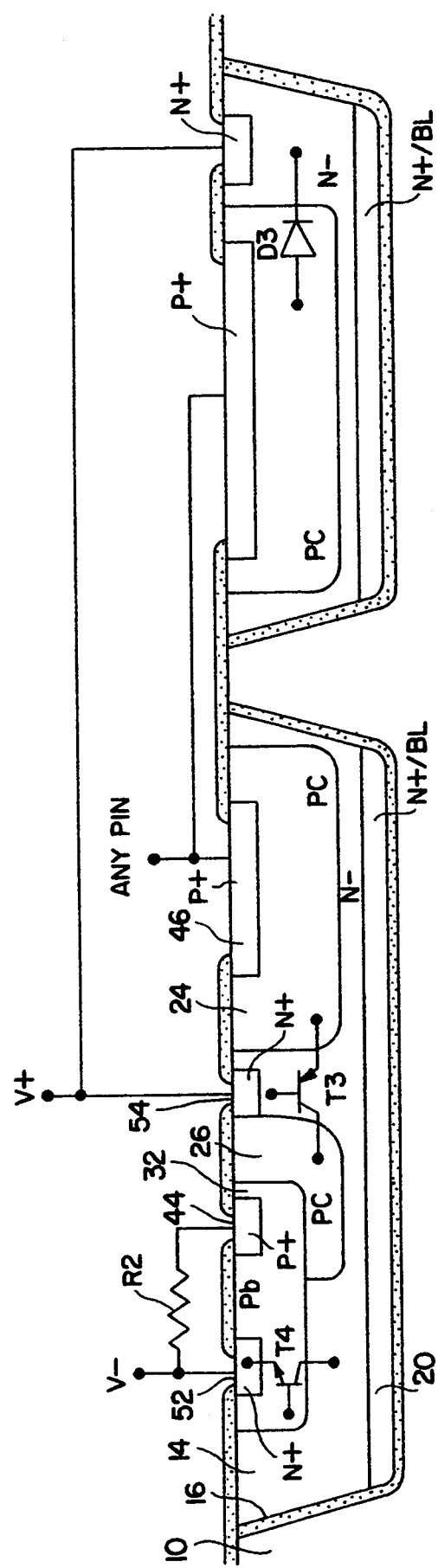
FIG. 4E provides another cross-sectional view of the protection circuit of FIG. 4A, further illustrating a preferred embodiment of the invention.

To prevent latchup, diode D3 and D4 are connected between the terminal PIN and the positive and negative supply respectively as shown in FIG. 9. Adding diodes D3 and D4 will help to prevent the base-emitter diodes of transistors T3 and T2 from respectively becoming forward biased because the voltage across them will be clamped. If there was a positive voltage present on the terminal PIN at the time the supplies were brought up, diode D3 would clamp the voltage across the base-emitter of transistor T3 since it is in parallel thereto. This clamping effect could be made more efficient in three ways. Make D3 a larger area diode than the base emitter diode of T3, use a diode for D3 with a low forward turn on, such as a Schottky diode, or put an extra diode in series with the base emitter of T3, such as D2. FIG. 4E illustrates diode D3 having a larger cross sectional junction area than that of the base emitter diode of T3. Although not illustrated, it is understood that the overall junction area of D3 is larger than that of the base emitter diode of T3. With reference to FIG. 4E, the base emitter junction of T3 corresponds to the junction between the collector region PC of T3 and the N− base region of T3. The diode D3 corresponds to the device illustrated in the electrically isolated island 14a, wherein the junction is at the interface of the P and N− regions.

With the clamping diodes in place when the supplies are brought up, the majority of the current that would have flowed through the base-emitter diode of T3 and cause SCR2 to latch up is instead flowing through D3. This current will cease to flow once the positive supply attains a high enough voltage, and the device will power up the rest of the way without SCR2 latching up. D4 acts the same way to prevent SCR1 from latching when the device is powered up with a negative voltage on the terminal PIN. In addition to preventing latchup during powerup, diodes D3 and D4 will also help to prevent latchup when the SCRs turn on for overshoot or undershoot of input signals above or below the supplies while the device is operating.

DC and AC characteristics of the device will be degraded by adding diodes D3 and D4, but the effect can be minimized. D3 and D4 should be kept at the minimum area needed to effectively clamp the base-emitter diode of T2 and T3. This will minimize the added capacitance. Also D3 and D4 should be fabricated from the same types of regions with matched junction areas. That way the reverse leakage currents of the two diodes will cancel each other out, and have little effect on the net DC leakage current seen on the terminal PIN.

Figure 10:
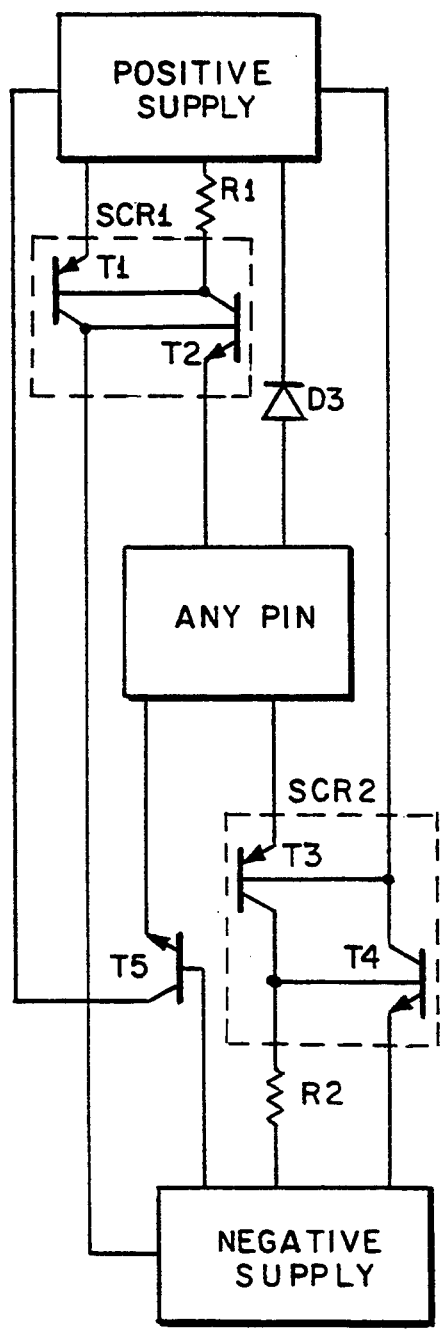
FIG. 10 is a modification of the protection circuit of FIG. 9.

While diodes D3 and D4 will help to prevent unwanted latchup, they do not prevent the SCRs from turning on when they are needed to protect against an ESD pulse when power is removed. For example, if a positive polarity ESD pulse from the PIN to the negative supply with the positive supply floating occurs, SCR2 should turn on and provide a low impedance discharge path. When the positive supply is floating, D3 has no real clamping effect on the voltage between the PIN and the negative supply. Therefore, this voltage will rise until it reaches the avalanche voltage of SCR2, at which time SCR2 will turn on and start to protect the device. Once SCR2 comes on, the collector current of T4 will predominantly be coming through D3. The betas are made high enough such that there is still enough current pulled out of the base of T3 to keep it on and keep the positive feedback in the SCR2 going until the ESD pulse has been fully discharged. The diodes D3 and D4 may be PN diodes, Schottky diodes or a junction of a bipolar or MOS transistor. As illustrated in FIG. 10, diode D4 is replaced by transistor T5 having its emitter connected to the PIN, its collector connected to the positive supply and its base connected to the negative power supply.

Figure 11:
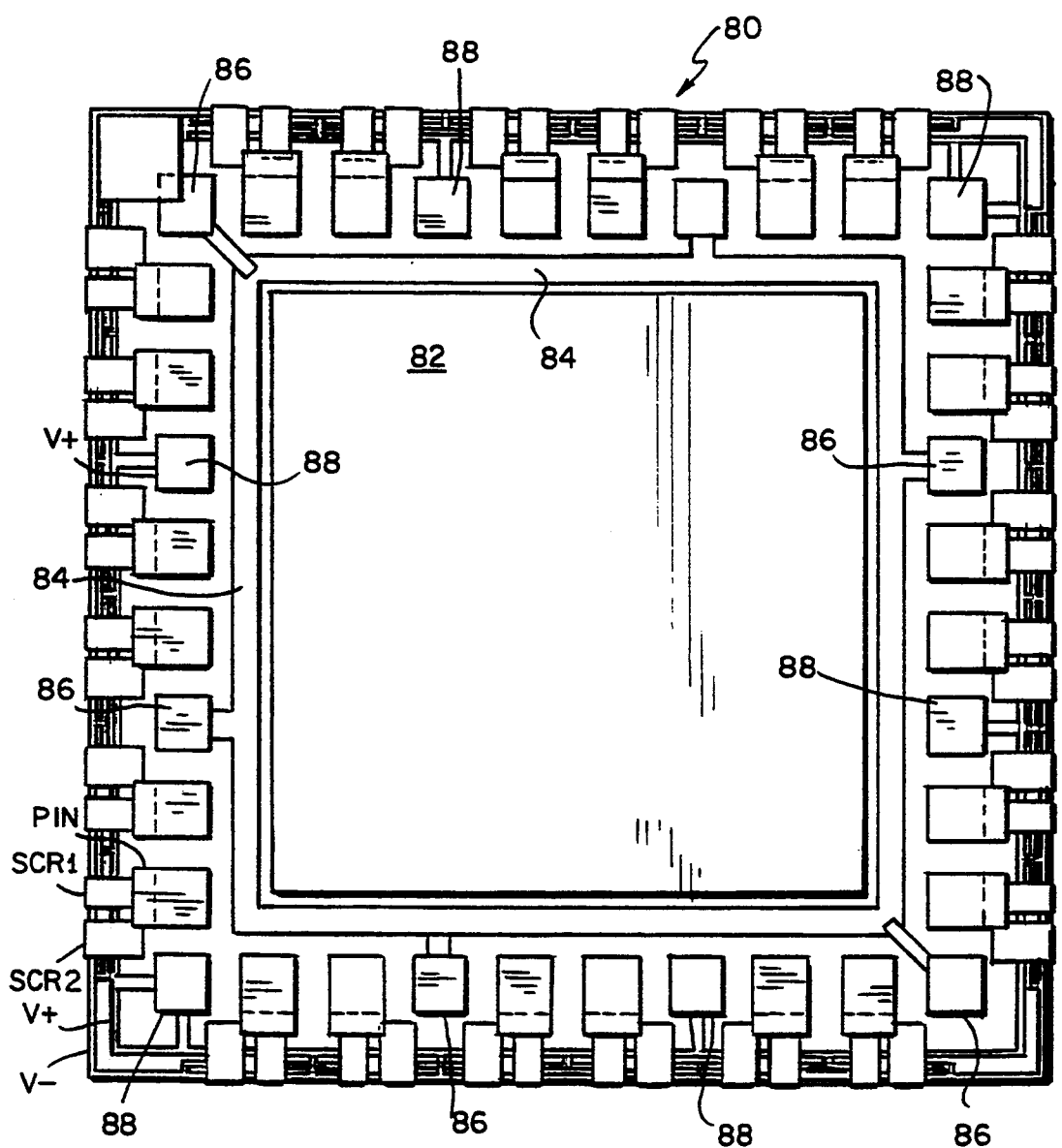
FIG. 11 is a plan view of an integrated circuit including the protection of the present invention.

An integrated circuit 80 which incorporates the circuitry to be protected as well as the ESD protection circuit of the present invention is illustrated in FIG. 11. The circuits to be protected are shown at 82 having a conductor 84 surrounding it and includes bonding pads 86 connected to conductor 84. Around the periphery of the die are the positive and negative power supply busses, V+ and V− and a plurality of bonding pads 88 connected to the V+ bus. Also about the periphery underneath the positive and negative busses are a plurality of ESD circuits including SCRs 1 and 2 connected to a respective bonding pad or pin. Not shown is the lead frame which is connected about the periphery of the integrated circuit 80 making contact with the bonding pads and providing access thereto exterior the housing which is generally a sealed package. Also not shown is the interconnection of the circuit to be protected 82 to the respective bonding pads for sake of clarity.

Figure 12:
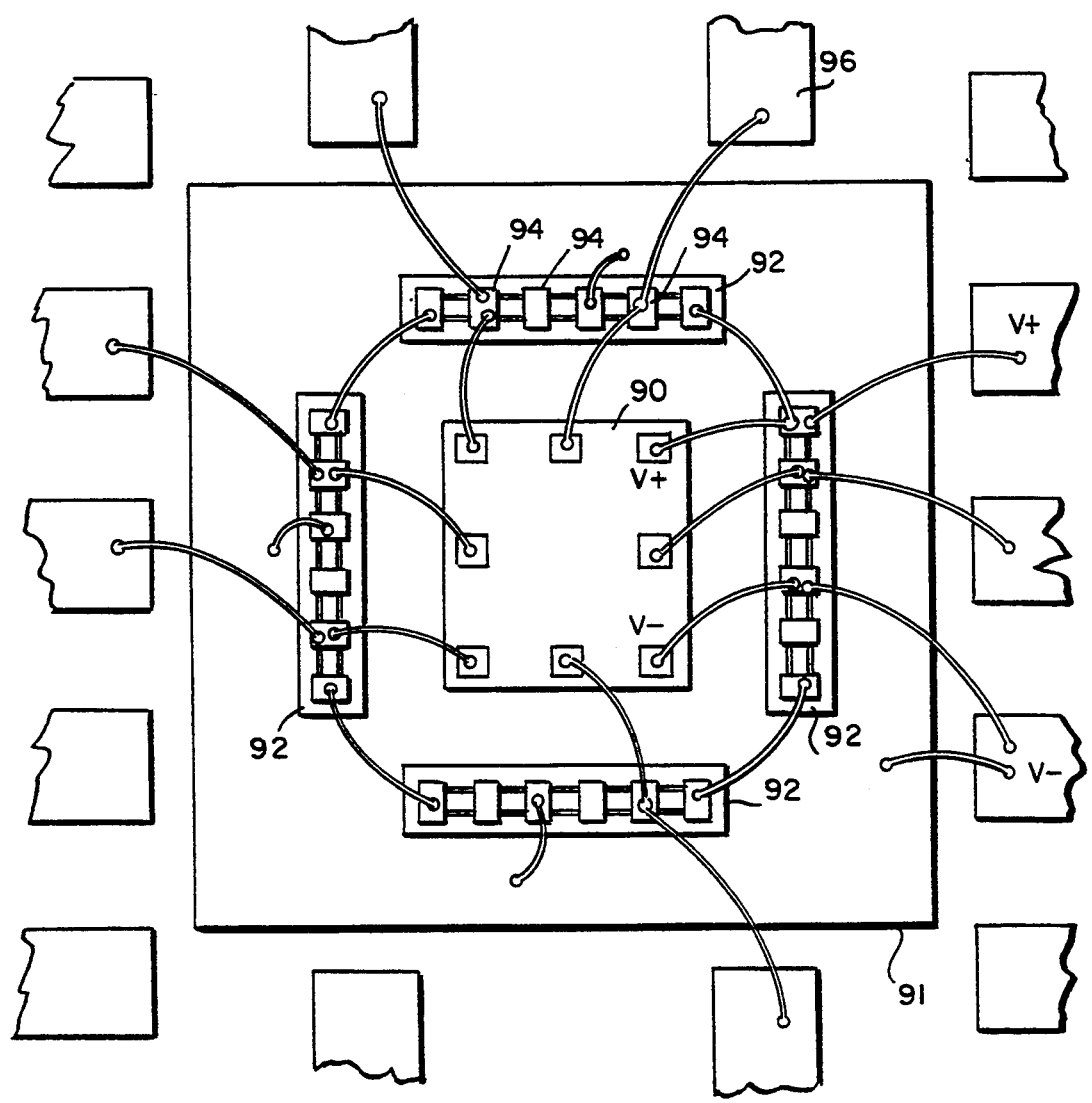
FIG. 12 is a plan view of a hybrid package incorporating the protection circuit of the present invention.

A hybrid protection circuit is illustrated in FIG. 12 wherein a housing 91 includes the integrated circuit 90 to be protected and a plurality of separate integrated circuits 92 including the ESD protection circuits 94 therein. The external leads 96 are connected to the individual ESD protection circuits 92 as well as the power leads. The integrated circuit is connected to the external leads through the protection integrated circuits 92. Thus a common package has a plurality of integrated circuits, one of which is the circuit to be protected and the other being the ESD protection circuit. This allows the provision of ESD protection circuits of the present invention without a modification of the die of the circuit to be protected 90.

Figure 13:
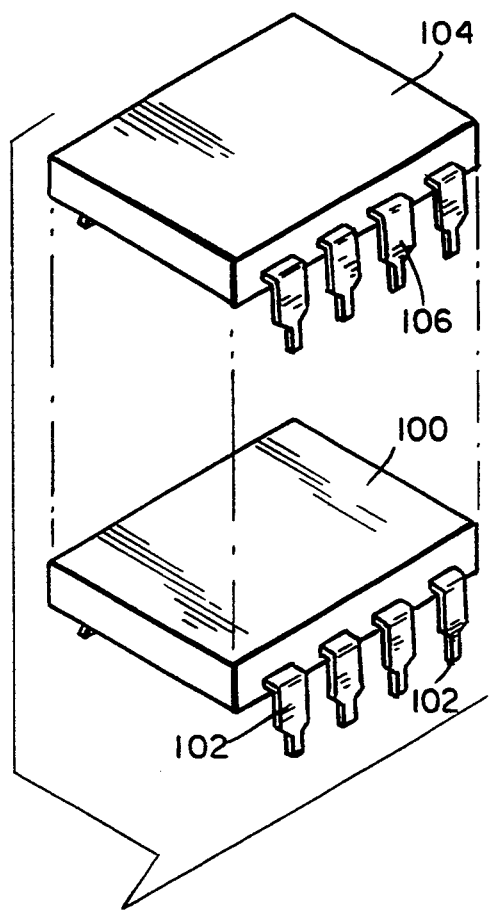
FIG. 13 is a perspective view of a piggyback embodiment of the protection circuit of the present invention.

The ability to retrofit pre-existing packages with protective circuitry is illustrated in FIG. 13. A standard packaged integrated circuit 100 is shown having leads 102. An integrated circuit including a plurality of protection circuits has its own separate package 104 and leads 106. The protection circuit 104 is stacked or piggybacked on the standard package 100 with the leads 106 making electrical contact with the leads 102. The package 104 for example, would include the peripheral ESD protection circuits and the bonding pads of FIG. 11 without the specific interior IC portion 82. By having so many pads available, it is possible to customize bonding diagrams such that the protection die can be used to match a wide variety of standard integrated circuit pinouts. Since ESD protection circuits have not been built into many types of integrated circuits, the ability to provide a piggyback package will allow protection to be provided which has not been heretofore available without modification of the original IC circuit or its packaging, or the printed circuit boards it is used in.

Although the present invention has been described and illustrated in detail, it is to be understood that the same is by way of illustration and example only, and is not to be taken by way of limitation. The spirit and scope of the present invention are to be limited only by the terms of the appended claims.

What is claimed:

1. A high voltage protection circuit, for a first circuit which has a terminal to be protected and first positive and negative supply terminals, comprising:
    a first terminal to be connected to the terminal of said first circuit to be protected;
    second positive and negative supply terminals to be connected to the first positive and negative power supply terminals of the first circuit;
    a first SCR having an anode and an anode gate connected to said second positive terminal, a cathode connected to said first terminal and a cathode gate connected to said second negative terminal for providing protective current paths for said first terminal.

2. A protection circuit according to claim 1 including a second SCR having an anode connected to said first terminal, an anode gate connected to said second positive terminal, and a cathode and a cathode gate connected to said second negative terminal for providing protective current paths for said first terminal.

3. A protection circuit according to claim 2 including a first resistor means in series between said anode gate of said first SCR and said second positive terminal and a second resistor means in series between said cathode gate of said second SCR and said second negative terminal.

4. A protection circuit according to claim 3, wherein said first and second resistor means prevent the respective SCR from turning on when power is applied to said second positive and negative terminals and will permit the respective SCR to turn on when power is removed from said second positive and negative terminals.

5. A protection circuit according to claim 3, wherein said first and second resistor means are fixed value resistors.

6. A protection circuit according to claim 3, wherein said first and second resistor means are variable value resistors, having higher resistive values when power is removed from said second positive and negative terminals than when power is applied to said second positive and negative terminals.

7. A protection circuit according to claim 6, wherein;
    said first resistor means includes a field effect transistor having a source drain path connected between said first SCR's anode gate and said second positive terminal and a gate connected to said second negative terminal; and
    said second resistor means includes a field effect transistor having a source drain path connected between said second SCR's cathode gate and said second negative terminal and a gate connected to said second positive terminal.

8. A protection circuit according to claim 3 including a first diode having an anode connected to said first SCR's cathode and a cathode connected to said first terminal, and a second diode having an anode connected to said first terminal and a cathode connected to said second SCR's anode.

9. A protection circuit according to claim 2 including:
   a third SCR having a cathode and an anode gate connected to said second positive terminal, an anode connected to said first terminal and a cathode gate connected to said second negative terminal; and
   a fourth SCR having a cathode connected to said first terminal, an anode gate connected to said second positive terminal and an anode and a cathode gate connected to said second negative terminal.

10. A protection circuit according to claim 9 including a first resistor means in series between said anode gate of said first and third SCRs and said second positive terminal and a second resistor means in series between said cathode gate of said second and fourth SCRs and said second negative terminal.

11. A protection circuit according to claim 2 including a first means connected between said cathode and cathode gate of said first SCR for preventing said first SCR from latching on when power is applied to said second positive and negative terminals and a second means connected between said anode and anode gate of said second SCR for preventing said second SCR from latching on when power is applied to said second positive and negative terminals.

12. A protection circuit according to claim 11 wherein said first means includes a first diode having a cathode connected to said first terminal and an anode connected to said second negative terminal, and said second means includes a second diode having a cathode connected to said second positive terminal and an anode connected to said first terminal.

13. A protection circuit according to claim 12 including a third diode having an anode connected to said first SCR's cathode and a cathode connected to said first terminal, and a fourth diode having an anode connected to said first terminal and a cathode connected to said second SCR's anode.

14. A protection circuit according to claim 12 wherein said first and second diodes are Schottky diodes.

15. A protection circuit according to claim 12 wherein said first and second diodes and the cathode—cathode gate diode and the anode—anode gate diode are each characterized by a pn junction area wherein said first diode has a larger junction area than the junction area of the cathode-cathode gate diode of said first SCR, and said second diode has a larger junction area than the junction area of the anode-anode gate diode of said second SCR.

16. A protection circuit according to claim 11 wherein:
   said first means includes an NPN transistor having a collector connected to said second positive terminal, an emitter connected to said first terminal and a base connected to said second negative terminal, and
   said second means includes a diode having a cathode connected to said second positive terminal and an anode connected to said first terminal.

17. A protection circuit according to claim 2 characterized by a first leakage current between said first terminal and said second positive terminal equal and opposite to a second leakage current between said first terminal and said second negative terminal during operation of the first circuit.

18. A protection circuit according to claim 1 including a first means connected between said cathode and cathode gate of said first SCR for preventing said first SCR from latching on when power is applied to said second positive and negative terminals.

19. A protection circuit according to claim 18 wherein said first means includes a first diode having a cathode connected to said first terminal and an anode connected to said second negative terminal.

20. A protection circuit according to claim 1 wherein said protection circuit is in an integrated circuit with said first circuit and has said first terminal connected to a terminal of said first circuit to be protected and said second positive and negative terminals connected to said first positive and negative power supply terminals of said first circuit respectively.

21. A protection circuit according to claim 20, wherein said integrated circuit includes positive and negative power supply busses and a plurality of bonding pads adjacent said busses; and
   including a plurality of protection circuits each connected to and adjacent to a pad to be protected and connected to said positive and negative power supply busses.

22. A protection circuit according to claim 20 wherein said first circuit is an analog circuit.

* * * * *